United States Patent
Xiong et al.

(10) Patent No.: US 10,707,138 B1
(45) Date of Patent: Jul. 7, 2020

(54) HIGH YIELD PACKAGE ASSEMBLY TECHNIQUE

(71) Applicant: Xilinx, Inc., San Jose, CA (US)

(72) Inventors: Shiying Xiong, San Jose, CA (US); Thao H. T. Vo, San Jose, CA (US); Felino E. Pagaduan, Morgan Hill, CA (US); Qi Xiang, San Jose, CA (US); Xiao-Yu Li, San Jose, CA (US); Glenn O'Rourke, Gilroy, CA (US)

(73) Assignee: XILINX, INC., San Jose, CA (US)

( * ) Notice: Subject to any disclaimer, the term of this patent is extended or adjusted under 35 U.S.C. 154(b) by 12 days.

(21) Appl. No.: 15/473,395

(22) Filed: Mar. 29, 2017

(51) Int. Cl.
*H01L 21/67* (2006.01)
*H01L 21/66* (2006.01)
*H01L 25/00* (2006.01)

(52) U.S. Cl.
CPC ........ *H01L 22/20* (2013.01); *H01L 21/67271* (2013.01); *H01L 25/50* (2013.01)

(58) Field of Classification Search
CPC .... H01L 22/20; H01L 21/67271; H01L 25/50
USPC .......................................................... 438/6
See application file for complete search history.

(56) References Cited

U.S. PATENT DOCUMENTS

| | | | | |
|---|---|---|---|---|
| 5,042,123 A * | 8/1991 | Mori | ............... | H01L 21/67276 198/341.06 |
| 5,844,803 A * | 12/1998 | Beffa | ............... | G01R 31/2894 700/121 |
| 6,219,908 B1 * | 4/2001 | Farnworth | ........... | G01R 1/0433 257/E21.509 |
| 6,477,685 B1 * | 11/2002 | Lovelace | ............... | H01L 22/20 257/E21.525 |
| 6,885,955 B1 * | 4/2005 | Atchison | ............ | G01R 31/2894 257/E21.525 |
| 6,939,727 B1 * | 9/2005 | Allen, III | ............... | H01L 22/20 257/E21.525 |
| 7,474,979 B1 * | 1/2009 | Stevens | ............ | G05B 19/41875 438/5 |
| 9,012,245 B1 * | 4/2015 | Klein | ............... | H01L 22/22 438/106 |
| 9,823,303 B1 * | 11/2017 | Ooi | ................... | G01R 31/31718 |
| 10,032,682 B1 * | 7/2018 | Klein | ............... | H01L 24/94 |
| 2002/0052053 A1 * | 5/2002 | Ono | ................... | G01N 21/9501 438/12 |
| 2003/0139838 A1 * | 7/2003 | Marella | ............... | G01N 21/55 700/110 |

(Continued)

*Primary Examiner* — Sheikh Maruf
(74) *Attorney, Agent, or Firm* — Patterson + Sheridan, LLP

(57) ABSTRACT

An integrated circuit (IC) chip package assembly apparatus and techniques for assembling IC chip packages are described. For example, a techniques for fabricating an IC package include (A) determining a first package assembly yield (PAY) across a first die pool comprising a first plurality of dies having a performance criteria within a first predefined range; (B) determining a second PAY across a second die pool comprising a second plurality of dies having a performance criteria within a second predefined range of performance criteria that is different than the first predefined range of performance criteria, the second plurality of dies comprising a portion of the first plurality of dies; and (C) generating a final assembly sequence in response to analyzing the first and second PAYs, the final assembly sequence comprising rules for combining dies in accordance with obtaining a higher of the first PAY and the second PAY.

18 Claims, 6 Drawing Sheets

(56) References Cited

U.S. PATENT DOCUMENTS

| | | | | |
|---|---|---|---|---|
| 2005/0000866 A1* | 1/2005 | Caparro | ................ | B07C 5/36 |
| | | | | 209/552 |
| 2005/0278597 A1* | 12/2005 | Miguelanez | ..... | G01R 31/31707 |
| | | | | 714/738 |
| 2006/0212253 A1* | 9/2006 | Velichko | ............ | G01R 31/2831 |
| | | | | 702/122 |
| 2007/0023121 A1* | 2/2007 | Jones | ................... | H01L 22/20 |
| | | | | 156/64 |
| 2007/0179743 A1* | 8/2007 | Tabor | ................... | G01R 31/01 |
| | | | | 702/182 |
| 2008/0189575 A1* | 8/2008 | Miguelanez | ....... | G05B 23/0229 |
| | | | | 714/25 |
| 2009/0085608 A1* | 4/2009 | Alzheimer | ............... | G06F 13/14 |
| | | | | 326/86 |
| 2009/0130782 A1* | 5/2009 | Itahashi | ................. | H01L 22/12 |
| | | | | 438/6 |
| 2009/0193294 A1* | 7/2009 | Nakamura | .......... | G06F 11/3612 |
| | | | | 714/26 |
| 2010/0004882 A1* | 1/2010 | Chu | ................. | G05B 19/41875 |
| | | | | 702/58 |
| 2010/0023294 A1* | 1/2010 | Fan | .................... | G01R 31/2834 |
| | | | | 702/123 |
| 2011/0093226 A1* | 4/2011 | Chieh-Chu | ...... | G05B 19/41875 |
| | | | | 702/82 |
| 2013/0124133 A1* | 5/2013 | Anemikos | ........ | G01R 31/31718 |
| | | | | 702/120 |
| 2013/0217208 A1* | 8/2013 | Chen | ................ | H01L 19/41875 |
| | | | | 702/82 |
| 2013/0275072 A1* | 10/2013 | Arnold | ............... | G01R 31/2889 |
| | | | | 702/108 |
| 2015/0234000 A1* | 8/2015 | Butler | ................ | G01R 31/2894 |
| | | | | 324/759.03 |
| 2015/0364214 A1* | 12/2015 | Li | ........................ | H01L 23/544 |
| | | | | 365/51 |
| 2017/0179077 A1* | 6/2017 | Lin | ......................... | H01L 24/95 |
| 2018/0114733 A1* | 4/2018 | Fan | ........................ | H01L 24/83 |
| 2018/0277408 A1* | 9/2018 | Abbet | ............... | G01R 31/2831 |

* cited by examiner

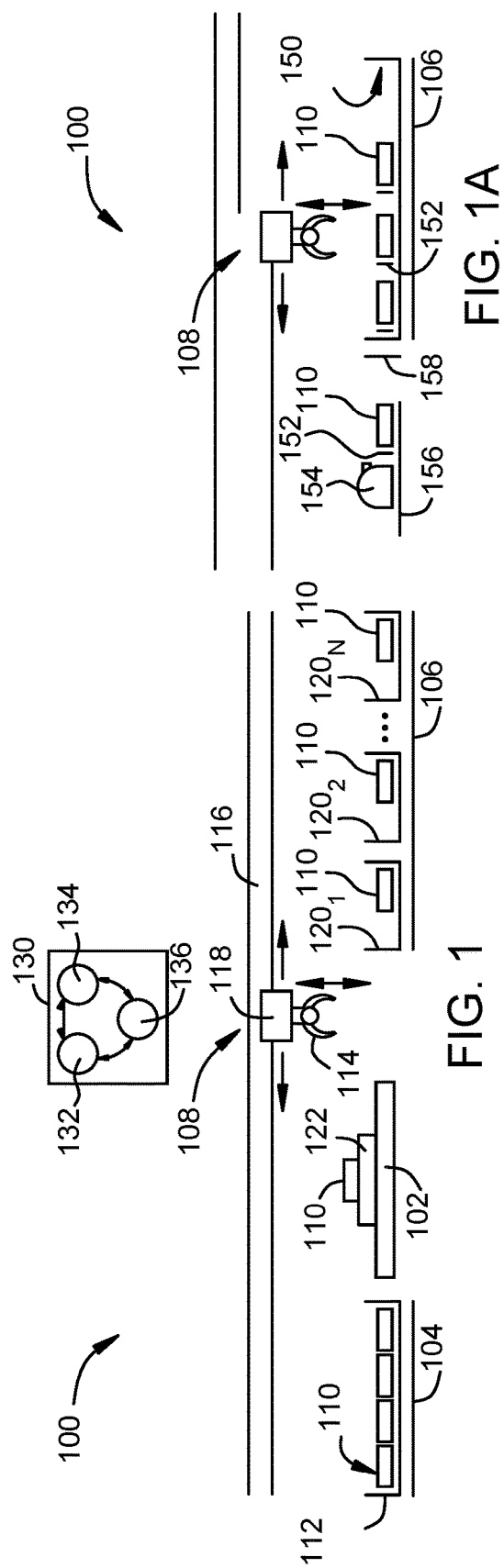
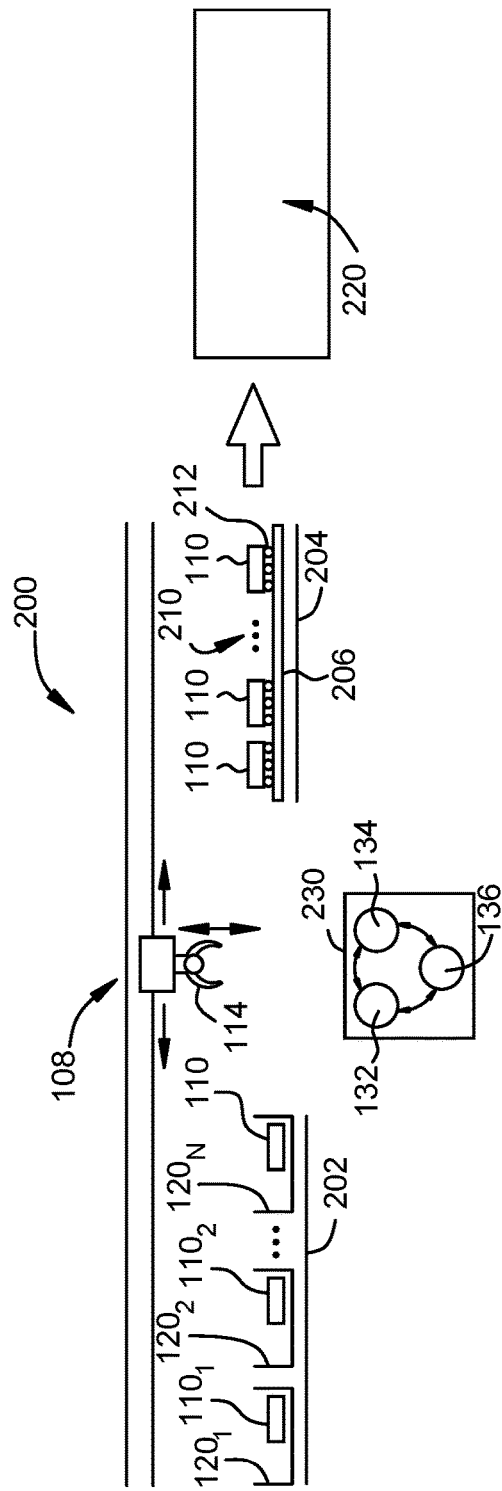

HIGH YIELD PACKAGE ASSEMBLY TECHNIQUE

TECHNICAL FIELD

Embodiments of the present invention generally relate to methods and apparatuses for assembling integrated circuit chip packages having integrated circuit (IC) dies.

BACKGROUND

Electronic devices, such as tablets, computers, copiers, digital cameras, smart phones, control systems and automated teller machines, among others, often employ electronic components which leverage chip package assemblies for increased functionality and higher component density. In chip packages having two or more dies arranged across a substrate, such as a package substrate or an interposer of the chip package, the dies are generally selected from a common lot according to a predefined performance criteria, which often is speed. Dies having substantially the same speed are further separated into bins having predefined processing characteristics, such as power. Dies are select from the various bins to forming the chip package. The typically assembly technique generally matches dies from bins with the highest and lowest performance for mounting on the substrate. However, such conventional fabrication techniques often do not have a satisfactory product yield, as many dies may not be matched. The unmatched dies undesirably increase fabrication costs.

Therefore, a need exists for improved techniques for fabricating chip packages.

SUMMARY

An integrated circuit (IC) chip package assembly apparatus and techniques for assembling IC chip packages are described that advantageously reduce fabrication costs by increasing yield as compared to conventional fabrication techniques.

An integrated circuit (IC) chip package assembly apparatus and techniques for assembling IC chip packages are described. For example, a techniques for fabricating an IC package include (A) determining a first package assembly yield across a first die pool comprising a first plurality of dies having a performance criteria within a first predefined range; (B) determining a second package assembly yield across a second die pool comprising a second plurality of dies having a performance criteria within a second predefined range of performance criteria that is different than the first predefined range of performance criteria, the second plurality of dies comprising a portion of the first plurality of dies; and (C) generating a final assembly sequence in response to analyzing the first and second package assembly yields, the final assembly sequence comprising rules for combining dies in accordance with obtaining a higher of the first package assembly yield and the second package assembly yield.

In another example, a method for fabricating an integrated circuit (IC) package includes (A) from a die pool, selecting a first predetermined number of dies for assembly, the first predetermined number of dies having performance criteria closest to one end of a range of performance criteria for the dies across the die pool; (B) determining that the first predetermined number of dies are acceptable for assembly into a first IC package in response to a performance criteria for the first predetermined number of dies satisfying a target performance criteria; (C) selecting from the die pool, a replacement die to replace one of the first predetermined number of dies for forming the first IC package in response to the performance criteria for the first predetermined number of dies not satisfying the target performance criteria, the replacement die and dies remaining from first predetermined number of dies satisfying the target performance criteria; (D) removing dies combinable for the first IC package from the die pool; and (E) iteratively performing (A), (B), (C) and (D) until no more IC packages can be formed from the die pool.

In yet another example, a tool for fabricating an integrated circuit (IC) package is provided. The tool includes an input station, an output station, a die handler and a controller. The input station is configured to retain a plurality of dies each of which having a known performance criteria and a location within the input station. The output station is configured to retain a substrate for mounting two or more selected dies from the plurality of tested dies. The die handler is configured to move the two or more selected dies from the input station to the output station. The controller is configured to control the operation of the die handler in accordance to a final assembly sequence selected in response to dies combined preferentially in accordance to a sequential order of performance criteria of dies within the die pool.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 is a schematic side view of an integrated circuit (IC) die test system.

FIG. 1A is a schematic side view of an alternative embodiment of the IC die test system of FIG. 1.

FIG. 2 is a schematic side view of an integrated circuit (IC) package assembly tool.

To facilitate understanding, identical reference numerals have been used, where possible, to designate identical elements that are common to the figures. It is contemplated that elements of one embodiment may be beneficially incorporated in other embodiments.

DETAILED DESCRIPTION

Figure 3:
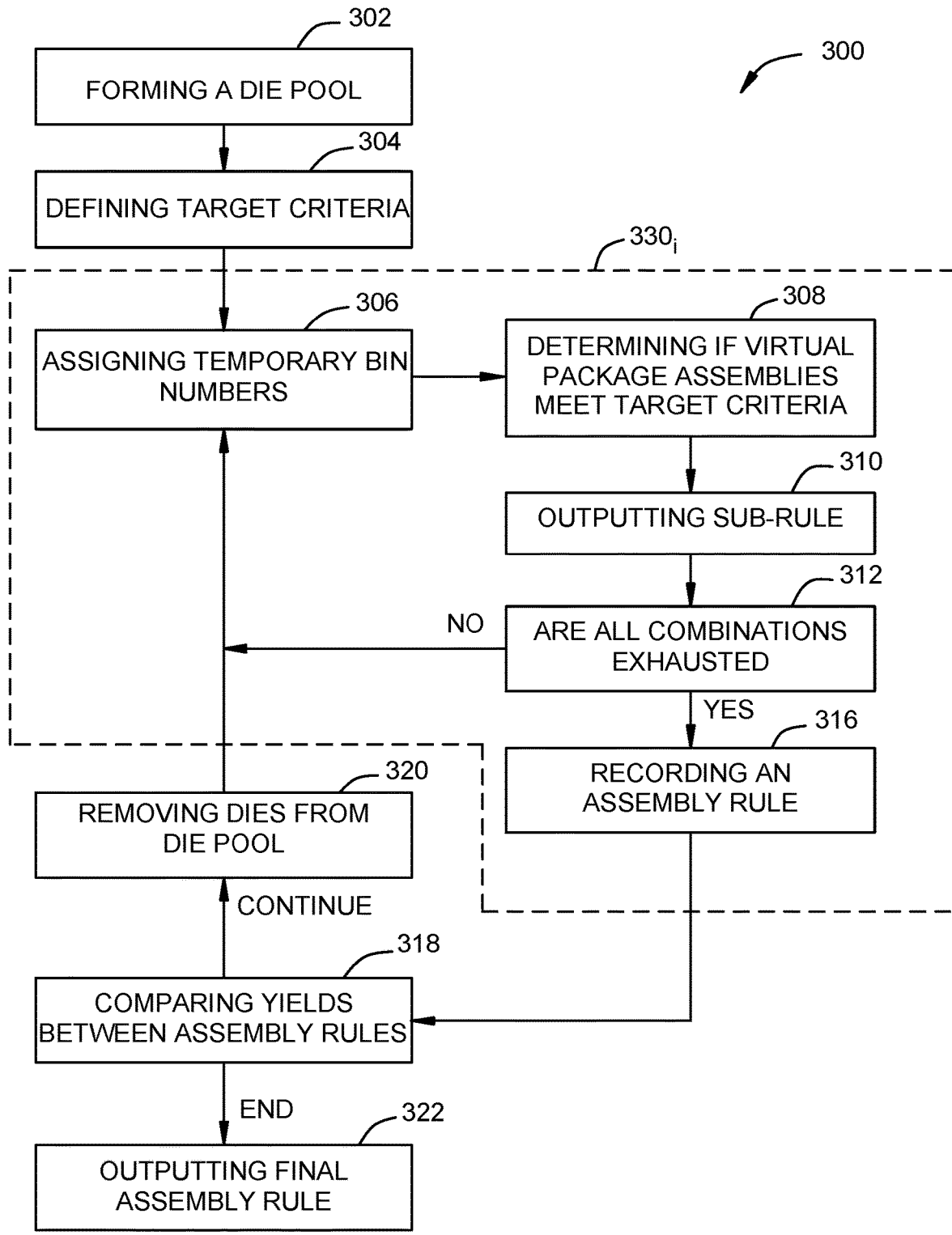
FIG. 3 is a flow diagram of a method for determining an assembly sequence.

An integrated circuit (IC) chip package assembly apparatus and techniques for assembling IC chip packages are described herein that advantageously reduce fabrication costs by increasing yield as compared to conventional fabrication techniques. In one example, dies are selected for assembly to a substrate from a plurality of bins, where each bin contains dies having similar performance criteria. This is, all dies within a single common bin fall within a predefined range of performance criteria, with different bins containing dies having different ranges of performance criteria. Potential assembly sequences are determined by iteratively matching dies preferentially from bins having dies with performance criteria located at a predetermined location within the die performance criteria spectrum for the dies across the bins. For example, dies having highest power are stored in a first bin while dies having the next lower power grouping stored in a second bin, and so on until the lowest power dies are stored in the last bin. Each iteration for determining potential assembly sequences successively starts by eliminating one less bin. In this example, bins having higher power dies are preferentially utilized first, thus, making the first bin having the highest power dies to predetermined location (also referred to as the "starting end") of the performance spectrum from which the bins are selected. It is contemplated that in other example, the predetermined location may be at the lowest end of the performance spectrum, or at a particular range within the performance spectrum. The device yield for each iteration is compared, and a final assembly sequence is selected from the iterations of potential assembly sequences that has the highest yield. Such techniques have demonstrated an improvement of over 2-3% for device yield, which is significant in terms of manufacturing costs.

In another example, dies in a die pool are uniquely associated with their performance criteria, and potential assembly sequences are determined by iteratively matching dies preferentially from dies with performance criteria located at predetermined end (i.e., starting end) of the die performance criteria spectrum for all dies across the pool. Each iteration successively starts by eliminating one less die from the die pool, such as the die having performance criteria closest to the starting end selected from the dies remaining in the die pool. The device yield for each iteration is compared, and a final assembly sequence is selected from the iterations of potential assembly sequences that has the highest yield. Advantageously, this technique may allow the die pool to extend across multiple lots, thus further improving the ultimate device yield. For example, such techniques have demonstrated an improvement of over 5% for device yield.

FIG. 1 is a schematic side view of an integrated circuit (IC) die test system 100. The die test system 100 generally includes a test station 102 having an input station 104 and an output station 106. The die test system 100 also includes a die handler 108 that is operable to move dies 110 between the input station 104, the test station 102 and the output station 106. The IC dies 110 may be field programmable gate array die, logic device die, memory device die and the like.

The input station 104 is generally configured to retain a cassette 112 that holds dies 110 to be tested in the test station 102. The dies 110 in the cassette 112 may belong to a specific production lot or other production grouping. The cassette 112 has an open top or sidewall configured to allow the die handler 108 to retrieve one or more selected dies 110 from the cassette 112.

The output station 106 is generally configured to retain a plurality of bins 120. Each bin 120 is configured to hold a plurality of dies 110 that have been tested in the test station 102. Each bin 120, shown in FIG. 1 as bin $120_1$ through bin $120_N$ where N is an integer greater than 1, holds dies 110 grouped by a predefined performance criteria, as further discussed below. The dies 110 within the bins 120 may be resorted and regrouped into the bins 120 in accordance with a final assembly rule prior to actual assembly. The dies 110 in the cassette 112 may belong to a specific production lot or other production grouping. The cassette 112 has an open top or sidewall configured to allow the die handler 108 to retrieve a selected one of the dies 110 from the cassette 112.

The die handler 108 may be robot, pick and place device or other mechanism suitable for picking dies from a cassette 112 disposed in the input station 104, placing the dies in the test station 102, and picking dies from the test socket of the test station 102 and placing the die in an appropriate bin 120 disposed in the output station 106.

In one example, the die handler 108 includes a gripper 114 operably configured to selectively grab, hold and place the die 110. The gripper 114 is movable in a vertical direction via a Z-actuator (not shown). The gripper 114 also is movable in a first horizontal direction via an X-actuator (not shown), and optionally movable in a second horizontal direction via a Y-actuator (not shown), wherein the first and second horizontal directions are substantially perpendicular. In the embodiment depicted in FIG. 1, the gripper 114 is coupled to a guide 118 that translates along a rail 116 so that the gripper 114 can be selectively positioned over the dies 110 in the input station 104, the test station 102, and over the output station 106. The motion of the die handler 108 may be controlled by a controller 130, such as a programmable logic controller (PLC) or other robotic motion control system.

The controller 130 is coupled to the various components of the test system 100 and is used to facilitate control of the motion of the die handler 108 and operation of the test station 102. The controller 130 generally includes a central processing unit (CPU) 132, a memory 134, and support circuits 136 for the CPU 132. The CPU 132 may be one of any form of computer processor that can be used in an industrial setting for controlling various chambers and subprocessors. The memory 134 is coupled to the CPU 132. The memory 134, or computer-readable medium, may be one or more of readily available memory such as random access memory (RAM), read only memory (ROM), floppy disk, hard disk, or any other form of digital storage, local or remote. The support circuits 136 are coupled to the CPU 132 for supporting the processor in a conventional manner. These circuits include cache, power supplies, clock circuits, input/output circuitry and subsystems, and the like.

A process, for example a method for testing dies 110, such as for example as described below, is generally stored in the memory 134, typically as a software routine. The software routine may also be stored and/or executed by a second CPU (not shown) that is remotely located from the test system 100 being controlled by the CPU 132. Although the process of the present invention is discussed as being implemented as a software routine, some of the method steps that are disclosed therein may be performed in hardware as well as by the software controller. As such, the invention may be implemented in software as executed upon a computer system, in hardware as an application specific integrated circuit or other type of hardware implementation, or a combination of software and hardware.

The test station 102 includes a socket 122 having pins or other suitable connectors for electrically coupling signals, power, ground and the like, to the contact pads formed on the bottom of the die 110. A pusher, not shown, is operable to apply a force to die 110 that urges the die 110 against the pins of the socket 122 with sufficient force to ensure good electrical connection between the contact pads of the die 110 and the pins of the 122 so as to facilitate testing.

The socket 122 of the test station 102 is coupled to the controller 130 or other processor that enables a test routine to be performed on the die 110 residing in the socket 122. The test routine may be utilized to test the functionality of the die 110 and to determine performance criteria of the die 110. Examples of performance criteria that may be measured using the test routine includes speed, power consumption, resistance, RC delay, temperature rise, and the like. The performance criteria measured for an individual die 110 is also referred herein as the tested performance criteria (TPC) or actual performance criteria.

Upon completion of the test routine, the die handler 108 retrieves the tested die 110 from the socket 122 and moves the tested die 110 to one of the bins 120 disposed in the output station 106. Generally, only dies 110 having speeds within a predetermined range are grouped together in a set of bins 120, also referred to as a bin pool. Thus, dies 110 having speeds within a predetermined range are disposed in set of the bins 120 shown in FIG. 1, while dies having different speed ranges are respectively disposed in different sets of bins (not shown).

For the set of the bins 120 having speeds falling within the predetermined range, dies 110 are grouped into the bins $120_{1-N}$ by predetermined performance criteria. Thus, each of bin 120 only contains dies 110 that have a performance criteria that falls within a predetermined range of performance criteria associated with that particular bin 120. In an example wherein the performance criteria is power, the dies $110_1$ having a first range of power consumption are grouped together in bin $120_1$, while dies $110_2$ having a second range of power consumption are grouped together in bin $120_2$, and dies $110_N$ having an $N_{th}$ range of power consumption are grouped together in bin $120_N$. Generally, the first range power consumption is the highest range of power consumption, the second range power consumption is the next lower range of power consumption, and so on, until the last or $N_{th}$ range of power consumption is the lowest range of power consumption for the dies 110 disposed in the bin pool.

Thus, when the test station 102 determines that the tested die $110_1$ has a power that falls within the first range of power consumption, the die handler 108 moves the tested die $110_1$ from the socket 122 and places the tested die $110_1$ within the bin $120_1$. Similarly, when the test station 102 determines that the tested die $110_N$ has a power that falls within the $N^{th}$ range of power consumption, the die handler 108 moves the tested die $110_N$ from the socket 122 and places the tested die 1101 within the bin $120_N$. This die sorting process continues until all the dies 110 are separated into different bins 120 according to power consumption.

FIG. 1A is a schematic side view of an alternative embodiment of the IC die test system 100 of FIG. 1. The die test system 100 of FIG. 1A includes an identification tag applicator 156 which is adapted to apply an identification (ID) tag 152 to each die 110. In one example, the identification tag applicator 156 applies the ID tag 152 to each die 110, for example, by printing, embossing, laser etching, labeling or bonding, among others. As such, the identification tag applicator 156 may be an ink jet or other printer, embossing device, laser or other etching device, a label application or other tag attaching device. In some embodiments, the tags 152 are removable so that the tags 152 may be reused after IC package assembly. In the example depicted in FIG. 1A, the identification tag applicator 156 is a label applicator 154.

The ID tag 152 may be a bar code, radio frequency (RF) transponder (i.e., RFID tag) or other machine readable tag. The ID tag 152 is associated with a discreet file of information stored or accessible by the memory of the controller 130, and more particularly, later accessible or provided to the controller of an assembly system, such as the assembly system described below with reference to FIG. 5. The discreet file associated with the ID tag 152 includes the TPC for the die 110 associated with the ID tag 152. The discreet file associated with the ID tag 152 may also include one or more of, but is not limited to, a unique IC package assembly identification number, the type of die, test results for the die (such as pass, fail or specific performance matrix such as power consumption, resistance, RC delay, temperature rise and the like), defect information, and location of the die 110 within the test system 100, among other information.

In contrast to placing the tested dies 110 in bins 120, the tested dies 110 are disposed in a carrier 150 disposed on the output station 106. The carrier 150 is generally segmented into regions each of which hold one of the dies 110 disposed on the carrier 150. The carrier 150 may also include an information tag 158 that uniquely identifies the carrier 150 from other carriers. Each region may be identified by a specific coordinate system of the carrier 150, so that the controller 130 or other processor may know which die 110 resides in a specific unique region of the carrier 150. For example, the regions may be arranged in rows and columns such that a particular region of the carrier 150 would have a unique row and column number combination. By associating the unique region of the carrier 150 with the specific die 110 disposed therein, the identity, test information and other information may be associated and tracked for that uniquely identified die 110 in instances wherein the die 110 does not have an ID tag 152 affixed thereto. That uniquely identified die 110 disposed in the carrier 150 may be tracked by any controller having access to the information tag 158 identifying the carrier 150.

As with the tag 152, the tag 158 may also be a bar code, radio frequency (RF) transponder (i.e., RFID tag) or other machine readable tag. Accordingly, the tag 158 must be of a type compatible for being read by the type of machine readable device utilized by the IC package assembly system.

The tag 158 is associated with a discreet file of information stored or accessible by the memory of the controller 130. The discreet file associated with the tag 158 may be is updated by the controller 130 with information relating to dies 110 disposed in the carrier 150. The information associated with the tag 158 may include, but is not limited to, one or more of a unique carrier identification number, the type of dies 110 contained in the carrier 150 bearing the tag 158, identification of specific dies 110 (for example, by row and column location, by tag 152, or by serial number) contained in the carrier 150, test results for specific dies 110 contained in the carrier 150, and defect information for specific dies 110 contained in the carrier 150, among other information. The information associated with the tags 158, and tag 152 when utilized, is provided to the controller of a package assembly system, such as the controller of the assembly system described with reference to FIG. 5, or other suitable assembly system.

FIG. 2 is a schematic side view of an integrated circuit (IC) package assembly tool 200. The assembly tool 200 includes an input station 202, an assembly platform 204, and a reflow station 220. The assembly tool 200 also includes a die handler 108 that is operable to move dies 110 between the input station 202 and the assembly platform 204. The die handler 108, or another robot not shown, is also operable to move IC packages 210 containing one or more of the dies 110 between the assembly platform 204 and the reflow station 220.

The input station 202 is generally configured to retain at least two or more of the plurality of bins $120_{1-N}$ containing dies 110 grouped by predetermined performance criteria. The die handler 108 is operable to pick dies 110 from the bins $120_{1-N}$ disposed on the input station 202 and move the dies 110 to the assembly platform 204. On the assembly platform 204, dies 110 are mounted on a substrate 206 to form an IC package 210. Circuitry within the dies 110 are generally mechanically and electrically coupled to circuitry within the substrate 206 utilizing solder paste 212. The substrate 206 may be a package substrate or an interposer.

After the dies 110 have been mounted to the substrate 206, the IC package 210 is moved to the reflow station 220. In the reflow station 220, the entire IC package 210 is heated to a temperature that melts the solder comprising the solder paste 212, then gradually cooled to solidify the melted solder into a solder connection, such as a micro-bump, that permanently connects the circuitry of the substrate 206 and dies 110. The IC package 210 may be heated by passing the IC package 210 through a reflow oven, under an infrared lamp or by soldering individual joints with a hot air pencil.

A controller 230 is utilized to control the motion of the die handler 108 and to determine which dies 110 from which bins 120 are utilized to assembly each IC package 210. The controller 230 may be the same or similar controller as the controller 130 described above.

The controller 230 generally includes a central processing unit (CPU) 132, a memory 134, and support circuits 136 for the CPU 132. The controller 230 determines an assembly sequence for assembling the IC package 210 by analyzing a number of potential assembly sequences based on production yield. The controller 230 may alternatively be loaded with the assembly sequence that was determined utilizing another computing device. The controller 230 also executes the assembly sequence by retrieving dies 110 from predetermined bins 120 utilizing the die handler 108, and mounting the dies 110 on the substrate 206 for assembling the IC package 210.

Figure 4:
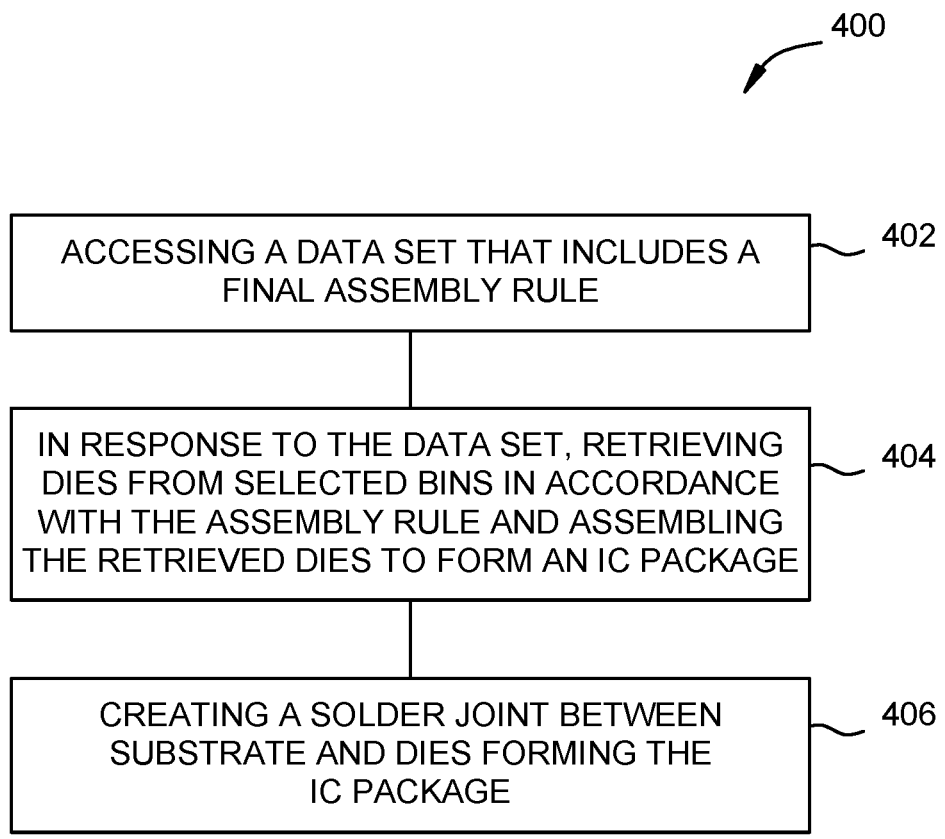
FIG. 4 is a flow diagram of a method for fabricating a package assembly utilizing the sequence determined utilizing the method of FIG. 3.

Processes, for example a method for determining an assembly sequence, such as for example as described below with reference to FIG. 3 and a method for assembling an IC package such as for example as described below with reference to FIG. 4, are generally stored in the memory 134, typically as a software routine. The software routine may also be stored and/or executed by a second CPU (not shown) that is remotely located from the test system 100 being controlled by the CPU 132. Although the process of the present invention is discussed as being implemented as a software routine, some of the method steps that are disclosed therein may be performed in hardware as well as by the software controller. As such, the invention may be implemented in software as executed upon a computer system, in hardware as an application specific integrated circuit or other type of hardware implementation, or a combination of software and hardware.

FIG. 3 is a flow diagram of a method 300 for determining a final production assembly sequence by comparing a number of virtual assembly sequences. The method 300 utilizes dies 110 selected from a group of dies 110 all falling within a common predetermined speed range. As discussed above, each bin 120 contains dies 110 having known performance criteria. In the example below, power is utilized as the performance criteria. However, other performance criteria may be utilized. Generally, the assembly tool will utilize a predetermined number of bins, which may be selected or provided an input variable when performing the method 300. Additionally, the starting point, when power is the performance criteria, is generally the die 110 or bin 120 containing the highest power dies 110 across the die pool. The starting point may alternatively be at a lowest threshold for a range of other performance criteria, or other point suitable for the performance criteria being utilized as a limiting design criteria. In the discussion of the method 300 below, reference is made to going to the "next lower" die 110 or bin 120 when utilizing a starting point that is at the upper end of the performance criteria. However, when the starting point that is at a lower end of the performance criteria, the next die 110 or bin 120 would be the next higher die 110 or bin 120 rather than "next lower" die 110 or bin 120 as described below. Additionally, the "next" bin 120 is also intended to be interpreted as the bin 120 containing the next group of dies 110 having performance criteria sequentially lower (or higher) than the immediately previous bin 120.

The method 300 begins at operation 302 wherein dies 110 are first selected to form an initial die pool based on a predefined die performance criteria (DPC). The DPC may be one or more of a specific performance matrix such as power consumption, resistance, RC delay, temperature rise and the like. In the example provided below, DPC is power consumption (i.e., power rating). Generally, the dies 110 comprising the initial die pool meet a minimum speed criteria and have a DPC that meets a predefined criteria. For example, the dies 110 comprising the initial die pool may all have a DPC in the form of a power rating that is below a selected initial threshold ($T_0$). The DPC for each die 110 and $T_0$ are provided to the controller performing the method 300.

Additionally at operation 302, the number "X" of the dies 110 which are to be assembled into each package 210 is provided as an input to the controller 230. X is a positive integer, and in the flow diagram depicted in FIG. 3 and the associated discussion below, X is three (3).

At operation 304, a predefined target criteria (PTC) is provided as an input to the controller 230. The PTC is generally the performance limit for a particular group of packages 210 being assembled by the assembly tool 200. In one example, the PTC may be an upper limit, wherein acceptable packages 210 having sum of the DPC's of the dies 110 residing in a package 210 is below the PTC. The sum of the DPC's of the dies 110 residing in a package 210 will be referred herein after as the package performance criteria (PPC). Thus, in the example above, an acceptable package 210 has a PPC that is less than the PTC.

In another example, the PTC may be a lower limit, wherein acceptable packages 210 having sum of the DPC's of the dies 110 residing in a package 210 is above the PTC. Thus, in the example above, an acceptable package 210 has a PPC that is more than the PTC.

In yet another example, the PTC may be a range having a lower limit and an upper limit, wherein acceptable packages 210 having sum of the DPC's of the dies 110 residing in a package 210 is within the range defined by PTC. Thus, in the example above, an acceptable package 210 has a PPC that is within the range defined by PTC.

After operation 304, a number of virtual assembly sequences $330_i$ are iteratively determined. Each assembly sequence $330_i$ determines an assembly rule for assembling IC packages 210 from the bins 120, along with a yield for that particular assembly sequence $330_i$. The assembly rule includes which dies are to be assembled in a package, along with the yield of packages meeting the PTC across the die pool. The assembly rules for each assembly sequence $330_i$ are compared to determine a final production assembly rule at operation 318. The final production assembly rule is also referred to as the final production assembly sequence. When performing the iterations of assembly sequences $330_i$ starting from a die pool that includes highest power dies and progressively eliminating dies having the highest power from the dies remaining in the die pool at each subsequent iteration of assembly sequence $330_i$, the yield for the assembly sequences $330_i$ will exhibit a bell shaped distribution when starting utilizing the highest power dies 110 and progressively utilizing lower powered dies 110 for each iteration of the assembly sequence $330_i$. Thus, in some embodiments that have a bell shaped yield distribution, the yield of a newly determined assembly sequence (NDAS) (e.g., the assembly sequence determined utilizing the current iteration of the assembly sequence 330) can be compared to the immediately previously determined assembly sequence (IPDAS) at operation 318. If the NDAS is less than the IPDAS, the IPDAS is determined as assembly sequence $330_i$ having the greatest yield and outputted to memory as a final production assembly sequence (PAS) at operation 322. The PAS is the production final assembly rule having the highest yield for assembling the IC packages 210 selective from the assembly rules determined at each iteration the assembly sequence $330_i$ as further described below. The PAS may be in the form of machine readable instructions executable by a controller of an IC package assembly tool, such as the tool 200 described above, or other suitable format. In other embodiments, the PAS may be selected after all or substantially all of the iterations of the assembly sequences $330_i$ have been exhausted.

Each assembly sequence 330 includes an assignment operation 306, a comparing operation 308, a sub-rule generation operation 310, a check bin pool operation 312, and recording operation 316. The sub-rule generation operation 310 is performed to record the results of the comparing operation 308. When conditions of the check bin pool operation 312 are not met, the current iteration of the assembly sequence 330 (i.e., NDAS) is completed at update operation 316. At the update operation 316, the yield and die assembly combinations of the highest yielding sub-rule for the current iteration of the assembly sequence 330 is calculated and stored as the assembly rule in memory as a data set (i.e., assembly rule for the current iteration of the assembly sequence 330). Stated differently, the assembly rule is the highest yielding assembly sub-rule saved at operation 310 for the current iteration of the assembly sequence 330. In subsequent iterations of the assembly sequence 330, the data set for the NDAS stored in memory may optionally overwrite the data set for the iteration of the assembly sequence 330 saved prior to the data set for IPDAS which the current assembly rule has a higher yield so that less memory is needed to perform the method 300.

Now describing the assembly sequence 330 in greater detail, the controller virtually assigns the dies 110, grouped by DPC, to respective bins 120 at assignment operation 306. For example, dies 110 having DPC's falling within a first range may be disposed in a first bin 120, while dies 110 having DPC's falling within a second range may be disposed in a second bin 120, and so on until all the dies 110 have been distributed among the available bins 120. The dies 110 may be evenly distributed across the bins 120. At the assignment operation 306, temporary bin numbers (TBN) are also assigned to all the bins 120. In one example of operation 306, the first TBN number is assigned to the bin 120 closest the starting end of the bin pool. In the example depicted in FIG. 3 where power is the performance criterial and PTC is an upper limit, bin $120_1$ is assigned $TBN_1$, bin $120_2$ is assigned $TBN_2$, etc., until all the bins 120 are assigned a TBN. Then, the bin $120_i$ are grouped into bin groups each having X number of bins 120. For example from the starting end of the bin pool, the bins are sequentially assigned TBN numbers in descending order of DPC for each bin 120. However, the TBNs may be assigned utilizing other or even random criteria.

During each iteration of the assembly sequence $330_i$, the operations 306, 308, 310, 312 are iteratively performed until all combination of bins have been virtually assembled and sub-rules recorded. For example, in a first iteration of operation 306, one of the bin groups assigned at operation 306 may include TBN's 1, 2 and 3. In a subsequent iteration of operation 306, one of the bin groups assigned at operation 306 may include TBN's 1, 2 and 4, which is a new and unique combination of bins as compared to the bin groups utilized in the first iteration of operation 306 of a common assembly sequence 330. Thus, operation 312 routes the virtual assembly, test and sub-rule generation back through operations 306, 308 and 310 until all potential combinations of bins have been analyzed. Once all combination of bins have been analyzed for a die pool associated with an iteration of the assembly sequence 330, operation 312 directs the method 300 to operation 316 as discussed above.

More specifically at operation 308, one die 110 is virtually selected from each bin assigned a TBN in a common bin group associated at operation 306 to form all possible VPAs for the grouping selected at operation 306. The combined power for each VPA is checked to determine if the PTC is met. The virtual package assembly is not a physically assembled package, but rather representation of a package that could be assembled utilizing the dies 110 for purposes of calculating the PPC. The PPC is determined for the VPA by summing the DPC of the dies 110 comprising the VPA. If the PPC meets the PTC, then the assembly sub-rule is outputted (e.g., saved to memory) indicating those specific dies 110 may be assembled to meet the PTC along with the identities of dies 110 that do not meet the PTC, so that assembly information including yield for the bins 120 being evaluated in the present iteration of operation 308. At operation 308, all die combinations for each bin group assigned at the present operation of 306 are analyzed. The assembly sub-rule generated at operation 310 is indicative of which bins 120 and bin groups are utilized during operation 308, the yield (i.e., percentage of dies meeting the PTC, and is potentially utilized for the actual physical assembly of the package 210 should a particular iteration of the assembly sequence $330_i$ be selected for actual implementation (e.g., become the final production assembly rule). The sub-rule (i.e., which dies are combined in each package) and number of combinable dies (i.e., yield) are stored as sub-data for a particular iteration of operations 306, 308, 310 performed within a single operation of the assembly sequence $330_i$.

At the check bin pool operation 312, the bin pool is checked to determine if another combination of bins 120 is available to be combined which has not been analyzed at operation 308. Thus, operation 312 determines if there a unique bin grouping that has yet to be assigned at operation 306. For example, if the TBN's 1, 2 and 3 were utilized to define one of the bin groups during the first iteration of operations 306, 308, and 310, then a bin group comprising TBNs 1, 2 and 4 has yet to be analyzed through operations 306, 308, 310. Each operation 312 routes the method 300 back to operation 306 until no more unique combinations of TBNs have yet be analyzed during the present iteration of assembly sequence 330. The iteration through operations 306, 308, 310 and 312 continue until all possible combinations of bins groups have been analyzed and their sub-rules recorded. Once all possible combinations of bins groups have been exhausted, then the method 300 proceeds to operation 316 for outputting an assembly rule. The assembly rule includes information indicating the dies in the die pool, which dies are to be assembled in a single package, which dies are associated to which bins, and the yield, among other information.

At operation 316, the highest yielding sub-rule is selected to be assigned as the assembly rule for the NDAS, and the assembly rule for the NDAS stored, for example, in memory as a data set. The yield for the NDAS is the highest yielding sub-rule for all the iterations of operation 308 performed within the single iteration of the assembly sequence $330_i$ associated with the NDAS. Each data set associated with a particular iteration of an assembly sequence $330_i$ may be uniquely identified for comparison with the IPDAS (or other assembly rules associated with other assembly sequences $300_i$) at operation 318.

As discussed above at operation 318, the yield of the NDAS determined utilizing the current iteration of the assembly sequence 330 may be compared to the IPDAS. If the NDAS yield is less than the IPDAS yield, the IPDAS is determined as assembly sequence $330_i$ having the greatest yield and outputted to memory as a final production assembly sequence (PAS) at operation 332. The PAS includes the rule associated the assembling the IC packages 210 according to the assembly sequence 330 as further described below. The PAS may be in the form of machine instructions executable by an IC package assembly tool, such as the tool 200 described above. If the NDAS is greater than the IPDAS, the yield of the NDAS has improved and since the yield data generally follows a bell shaped distribution, the method 300 then proceeds through a recalculation sequence that routes through operation 320 back to operation 304 prior to performing the next iteration of the assembly sequence $330_i$.

Alternatively, the method 300 does not have to proceed to operation 322 based on NDAS yield is less than the IPDAS yield, rather, any number of additional iterations of the assembly sequence $330_i$ may be performed and the assembly rule for all the assembly sequences $330_i$ may be analyzed together to determine which assembly rule for a particular assembly sequence 330 has the highest yield. Thus, the assembly sequence 330 with the highest yield is then assigned as the PAS at operation 332.

If the NDAS is greater than the IPDAS or additional iterations of the assembly sequence $330_i$ are desired, the method 300 then proceeds through a recalculation sequence that routes through operation 320 back to operation 306 to perform another iteration of the assembly sequence $330_i$.

At operation 320, one or more dies 110 are removed from the die pool. In one embodiment, one or more dies 110 that are closest to the starting point are removed from the die pool. In the example illustrated in FIG. 3, one or more dies 110 having the highest DPC are removed from the die pool. In one example, the current performance threshold ($T_0$ in the first iteration of the assembly sequence 330) is reduced ($T_R$) and dies 110 having performance thresholds exceeding $T_R$ are removed from the die pool. The amount that the performance threshold is reduced may be predetermined amount or selected in another manner. Alternatively, a predetermined number of dies 110 present in the last iteration of the die pool and having the highest DPC are removed from the die pool. The number of dies 110 removed may be predetermined number or selected in another manner. Should the PTC be a range, the dies 110 closest to the starting point may be at opposite ends of the spectrum of die performance criteria for the dies within the bin pool, wherein dies should be removed from the spectrum of die performance criteria farthest from the PTC. Once the dies 110 have been removed from the die pool and a new die pool established at operation 320, the method 300 proceeds to operation 306 to perform another iteration of the assembly sequence 330.

At the second and subsequent iterations of the assembly sequence 330, the iteratively smaller die pool is identified to the controller 230. The method 300 then continues through another iteration of the assembly sequences $330_i$ as described above, until ultimately, the criteria at operation 318 determines that the method 300 proceeds to and terminates at operation 322 with the PAS identified.

Thus, by iteratively determining potential yields and assembly rules for various assembly sequences, the assembly sequence and associated assembly rule may be outputted as a production sequence for IC package assembly. This technique has demonstrated at least a 2% improvement over traditional conventional IC package assembly techniques.

FIG. 4 is a flow diagram of a method 400 for fabricating an IC package 210 utilizing the sequence determined utilizing the method 300 of FIG. 3 or other suitable technique. The method 400 begins at operation 402 where the controller 230 accesses the data set, including the final assembly rule, that is outputted at operation 322 of the method 300. If the method 300 was performed by the controller 230, the data set would be stored in the memory of the controller 230. Alternatively, the data set may be transmitted to or accessed by the controller 230 from a processor, memory or other source remote from the controller 230. The data set may be in the form of machine instructions executable by the controller 230, or as input data for an assembly program residing in the memory or otherwise executable by the controller 230. Although the method 400 is described as being performed utilizing the assembly tool 200, IC packages 210 may be assembled using the method 400 using other assembly tools.

At operation 404, the controller 230, in response to the data set, instructs the die handler 108 to retrieve dies 110 from selected bins 120 in accordance with the assembly rule. The dies 110 may be previously arranged in the bins 120 in accordance with the assembly rule, or may be redistributed in accordance with the assembly rule at operation 404. The dies 110 are mounted on a substrate 206 utilizing solder paste 212 to form the.

At operation 406, the IC package 210 is move to the reflow station 220. In the reflow station 220, the entire IC package 210 is heated to a temperature that melts the solder comprising the solder paste 212, and then cools and solidifies the melted solder into a solder connection, such as a micro-bump, that permanently connects the circuitry of the substrate 206 and dies 110 forming the IC package 210. The IC package 210 may be heated by passing the IC package 210 through a reflow oven, under an infrared lamp or by soldering individual joints with a hot air pencil. After processing in the reflow station 220, the IC package 210 may have one or more finishing operations performed, such as disposing underfill material between the dies 110 and substrate 206, securing stiffeners to the substrate 206, disposing a lid over the dies 110, adding heat sinks, and the like. Advantageously, by utilizing the data set provided by method 300 during the assembly method 400, production yields are substantially higher, thus contributing to lower manufacturing and product costs.

Figure 5:
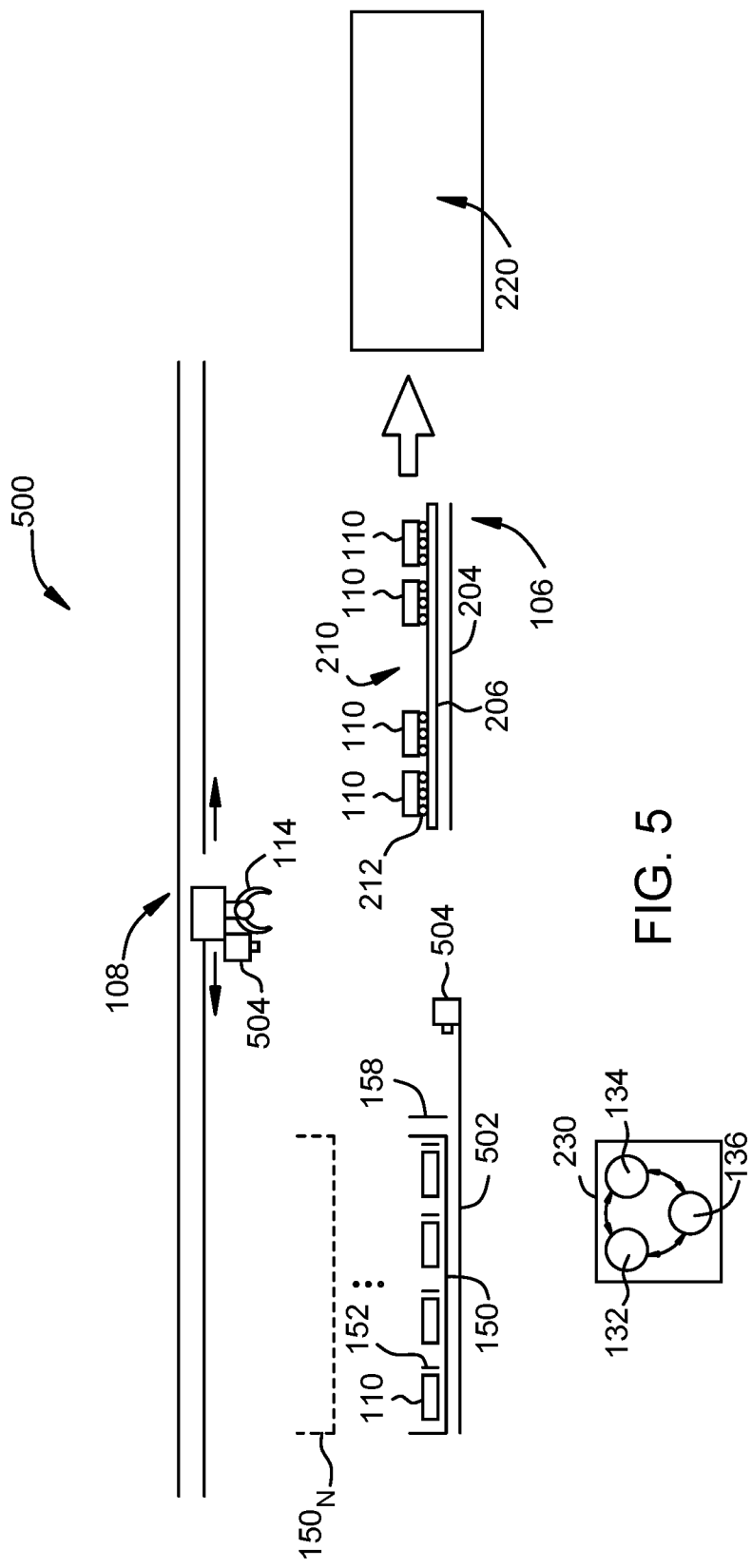
FIG. 5 is a schematic side view of an integrated circuit (IC) package assembly tool.

FIG. 5 is a schematic side view of an integrated circuit (IC) package assembly tool 500. The assembly tool 500 includes an input station 502, an assembly platform 204, one or more automatic identification and data capture (AIDC) devices 504, and a reflow station 220. The assembly tool 500 also includes a die handler 108 that is operable to move dies 110 between the input station 502 and the assembly platform 204. The die handler 108, or another robot not shown, is also operable to move IC packages 210 containing one or more of the dies 110 between the assembly platform 204 and the reflow station 220.

The die handler 108, the assembly platform 204 and the reflow station 220 are substantially identical to the die handler 108, the assembly platform 204 and the reflow station 220 described above with respect to FIG. 2. The die handler 108, or other robot, may be configured to transport one or more carriers 150. It is contemplated that other suitable die handlers, assembly platforms and reflow stations may be utilized.

The input station 502 is generally configured to retain at least one or more carriers 150 containing dies 110 individually identified by the predetermined performance criteria for each respective die utilizing the ID tag 152. Alternatively, the input station 502 may be configured as a rack, cassette, platform or other structure for supporting one or more carriers 150, or for supporting dies 110 removed from the carriers 150 in a position accessible for the die handler 108. As discussed above, each die 110 disposed in the carrier 150 may be affixed with an ID tag 152. Alternatively, a single ID tag 152 may be affixed to each the carrier 150, wherein each die 110 is disposed in within the carrier 150 in a unique known position so that TPC for each unique die 110 within the carrier 150 is available to a controller 230 that controls the operation of the assembly tool 500. In the example depicted in FIG. 5, N additional carriers 150N are shown disposed in the input station 502. The additional carriers 150N may be stacked, placed in a planar array or otherwise located in, or movable within, the input station 502 in a position that presents a desired one of the dies 110 disposed in a selective one of the additional carriers 150N for retrieval by the die handler 108.

The AIDC device 504 is interfaced with the controller 230 that is utilized to control the operation of the IC package assembly tool 500, including the operation of the die handler 108 and handling information read by the AIDC device 504. The controller 230 is also utilized to track information uniquely related to each die 110.

The AIDC device 504 is disposed in a location within the assembly tool 500 suitable for enabling the identification tags 152 and/or tags 158 to be read so that information (i.e., location, performance criteria, etc.) relating each individual die 110 within the tool 500 is available to the controller 230. Accordingly, the AIDC device 504 must be of a type compatible for reading the type of machine readable ID tag 152 (and/or tag 158) being utilized. In one example, the AIDC device 504 may be a RFID reader, a barcode reader, a camera or other suitable tag reading device.

In one embodiment, the AIDC device 504 is disposed in the input station 502 in a position to read the identification tags 152 affixed to the carrier 150. In another embodiment, the AIDC device 504 connected to the die handler 108 so that the ID tag 152 affixed to the carrier 150, if present, and/or the identification tags 152 affixed to the dies 110 disposed in the carrier 150 may be read.

The controller 230 manages the information associated with the tag 158, and/or the ID tag 152. For example, information (such as TPC) regarding test results (such as pass, fail or specific performance matrix such as power consumption, resistance, RC delay, temperature rise and the like) may be accessed from the file corresponding to a specific die 110 contained in the carrier 150 associated with the tag 158 and/or ID tag 152. Although the information is generally associated to batches and/or specific dies 110 through unique information tags affixed to a carrier, as discussed above, when the dies 110 themselves include a unique machine readable ID tag 152, the AIDC device 504 and controller 230 may be utilized to track and store information associated with those dies 110 without associating particular dies 110 to a specific carrier.

As with the assembly tool 200 described above, the controller 230 controls the operation of the die handler 108 such that the die handler 108 is operable to pick predetermined dies 110 from the one or more carriers 150 disposed on the input station 202 and move the dies 110 to the assembly platform 204 for assembly. On the assembly platform 204, dies 110 are mounted on a substrate 206 to form an IC package 210. Circuitry within the dies 110 are generally mechanically and electrically coupled to circuitry within the substrate 206 utilizing solder paste 212. As discussed above, the substrate 206 may be a package substrate or an interposer.

After the dies 110 have been mounted to the substrate 206, the IC package 210 is move to the reflow station 220. In the reflow station 220, micro-bumps are formed to permanently connect the circuitry of the substrate 206 and dies 110 as discussed above.

The controller 230, as discussed above, generally includes a central processing unit (CPU) 132, a memory 134, and support circuits 136 for the CPU 132. The controller 230 determines an assembly sequence for assembling the IC package 210 by determining an assembly sequence preferentially utilizing the die 110 with the TPC closest to the starting point. The controller 230 may alternatively be loaded with the assembly sequence that was determined utilizing another computing device, such as the controller 130 of the test system 100 or other remove processor. The controller 230 also executes the assembly sequence by retrieving predetermined dies 110 from the one or more carriers 150 utilizing the die handler 108, and mounting the dies 110 on the substrate 206 for assembling the IC package 210.

Figure 6:
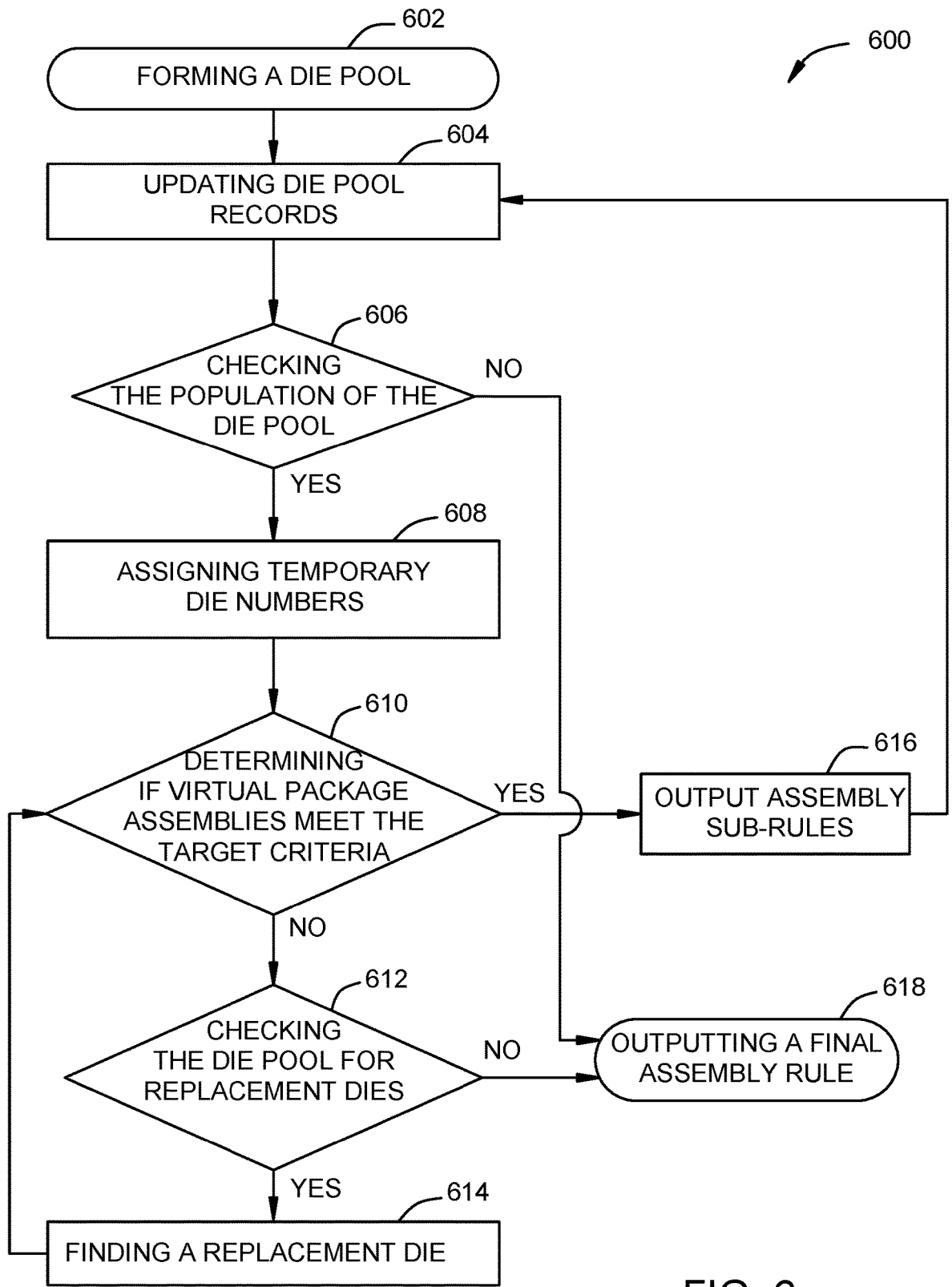
FIG. 6 is a flow diagram of a method for determining an assembly sequence.
Figure 7:
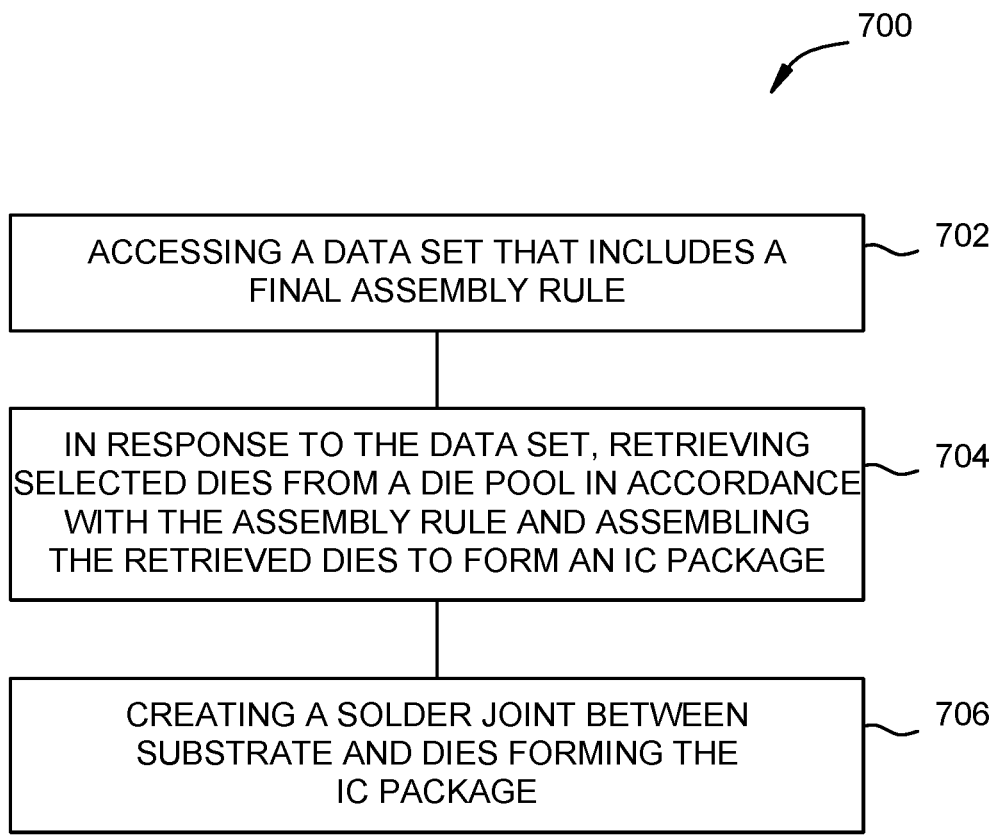
FIG. 7 is a flow diagram of a method for fabricating a package assembly utilizing the sequence determined utilizing the method of FIG. 7.

Processes, for example a method for determining an assembly sequence, such as for example as described below with reference to FIG. 6 and a method for assembling an IC package such as for example as described below with reference to FIG. 7, are generally stored in the memory 134, typically as a software routine. The software routine may also be stored and/or executed by a second CPU (not shown) that is remotely located from the test system 100 being controlled by the CPU 132. Although the process of the present invention is discussed as being implemented as a software routine, some of the method steps that are disclosed therein may be performed in hardware as well as by the software controller. As such, the invention may be implemented in software as executed upon a computer system, in hardware as an application specific integrated circuit or other type of hardware implementation, or a combination of software and hardware.

FIG. 6 is a flow diagram of a method 600 for determining an assembly sequence. The method 600 begins at operation 602 by establishing a die pool. The die pool may be established by entering or transferring the data set of associated with the tag 152, 158 containing the TCP and location information to memory of the controller 230 or other processor determining the assembly sequence method 600. The die pool may include newly tested dies 110 from the test system 100, and may also include previously tested dies 110 that have not been part of a final production sequence that was a result of a prior iteration of the method 600, or dies from another source.

At operation 602, the controller 230 is also provided with various assembly criteria. For example, at operation 602 the controller is provided with the number of dies (X) per IC package 210, and the PTC.

At the first iteration of operation 604, the controller 230 updates the die pool records and virtually sorts dies 110 in order of the TPC for the dies 110 comprising the die pool. At subsequent iterations of operation 604, the controller 230 updates the die pool records and virtually sorts dies 110 in order of the TPC for the dies 110 remaining in the die pool.

At operation 606, the population of the die pool is checked against the number of dies needed to form an IC package. For example at operation 606, the controller 230 determines if the number of dies 110 in the die pool are greater than or equal to X. If this criteria is met, the method 600 proceeds to operation 608.

At operation 608, the controller assigns a temporary die number (TDN) to the X number of dies 110 closest to the starting end. For the first iteration of operation 306, the first TDN number is assigned to the die 110 closest the starting end of the die pool. In the example depicted in FIG. 6 where power is the performance criterial and PTC is an upper limit, die 110$_1$ is assigned TDN$_1$, die 110$_2$ is assigned TDN$_2$, etc., until all the X number of dies 110 are assigned a TDN. In other words, the first X number of dies 110 from the starting end of the die pool are sequentially assigned TDN numbers in descending order of TPC for each die. The TPC for each die is retrievable by the controller 230 utilizing the data set associated with the tags 152 and/or 158 provided to the controller at operation 602.

At operation 610, the TPC for the dies 110 having a TDN and forming a virtual package assembly VPA are summed to calculate the PPC. As discussed above, the virtual package assembly VPA is not a physically assembled package, but rather representation of a package that could be assembled utilizing the dies 110 for purposes of calculating the PPC.

If the PPC meets the PTC, then an assembly sub-rule is outputted (e.g., saved to memory) at operation 616. The assembly sub-rule is indicative of which dies 110 are utilized during operation 610 are combinable to meet the PTC requirements, and will be later utilized for the actual physical assembly of the package 210. Also at operation 616, the dies 110 assigned a TDN are removed from the die pool.

From operation 616, the method 600 then proceeds to operation 604 wherein the die pool records are updated to reflect that the dies 110 removed from the die pool at operation 616 are no longer available for combination.

Following updating the die pool records at operation 604, the method 600 then loops through operations 606, 608, 610 and 616 until the criteria of operation 608 is not met. When the criteria of operation 608 is not met, the method 600 proceeds to operation 618. At operation 618, the sub-rules are combined into a final assembly rule that includes instructions indicating which uniquely identified dies 110 are to be combined to form individual IC packages 210. Any die not utilized in the final assembly rule are made available for the next iteration of the method 600 at operation 602.

In any iteration of operation 610 should the PPC be less than the PTC, the method 600 proceeds to operations 612 and 614 where a replacement die is sought for the VPA. At operation 612, the controller 230 determines if any dies are currently available from the die pool to replace any of the dies currently assigned a TDN. If no dies 110 are available from the die pool, the method proceeds to operation 618 where the final assembly rule is determined. If a die 110 is available from the die pool, the method proceeds to operation 614.

At operation 614, the controller 230 performs a binary search of the memory of the controller 230 to final a replacement die 110$_R$ from the dies 110 remaining in the die pool that has a PTC closest to the PTC of one of the dies 110 currently assigned a TDN. Which of the dies having a TDN is to be replaced by the replacement die 110$_R$ may be determined as follows. The die 110 having the TDN closest to the starting end is first tentatively replaced with the replacement die 110$_R$ and the PTC of the dies are analyzed confirm that the a sequential relationship of TPC between the dies. In the case where power is the performance criteria and the starting end is the highest power, the relationship may be expressed as TDN$_1 \geq$ TDN$_2$ ∘ ∘ ∘ $\geq$ TDN$_N$. In other words, if the replacement die 110$_R$ is first tested to tentatively replace die TDN$_1$, then the PTC for the replacement die 110$_R$ must be greater than or equal to the PTC of die TDN$_2$, while TDN$_2$ has a PTC greater than or equal to the PTC of die of the next sequentially higher TDN. If this relationship cannot be met, then the die 110 having the next lowest TDN is iteratively tentatively replaced with the replacement die 110$_R$ and the PTC of the dies are analyzed confirm that the relationship of TDN$_1 \geq$ TDN$_2$ ∘ ∘ ∘ $\geq$ TDN$_N$. In other words, if the replacement die 110$_R$ is subsequently tested to tentatively replace die TDN$_2$, then the PTC for the replacement die 110$_R$ must be less than the PTC of die TDN$_1$ while being greater than or equal to the PTC of die TDN$_2$, while TDN$_2$ has a PTC greater than or equal to the PTC of die of the next sequentially higher TDN. Once this relationship is met at operation 614, the method 600 proceeds to operation 610.

If the conditions of operation 610 are met, the method 600 proceeds to operation 616 where a sub-rule is saved, the combinable dies are removed from the die pool, the temporarily removed dies are returned to the die pool, and the method 600 returns to operation 604. If the conditions of operation 610 are not met, the method 600 proceeds to loop back through operations 612 and 614 until either the conditions of operation 610 are eventually met, or the conditions of 612 are not met. When the conditions of 612 are not met, the method 600 proceeds to operation 618. At operation 618, the temporarily removed dies are added to the dies not utilized in the final assembly rule and made available for the next iteration of the method 600 at operation 602. As discussed above, the final assembly rule is a summation of all the assembly sub-rules which identify which specific dies are to be combined on a common substrate to form the IC die packages.

Thus, by iteratively determining potential yields and assembly rules for various assembly sequences, the assembly sequence and associated assembly rule may be outputted as a production sequence for IC package assembly. This technique has demonstrated at least a 5% improvement over traditional conventional IC package assembly techniques when implemented for a single lot, and upwards of an 11% improvement over traditional conventional IC package assembly techniques when implemented for across multiple lots.

FIG. 7 is a flow diagram of a method 700 for fabricating an IC package 210 utilizing the sequence determined utilizing the method 600 of FIG. 7 or other suitable technique.

The method 700 begins at operation 702 where the controller 230 accesses the data set containing the final assembly rule that is outputted at operation 618 of the method 600. If the method 600 was performed by the controller 230, the data set would be stored in the memory of the controller 230. Alternatively, the data set may be transmitted to or accessed by the controller 230 from a processor, memory or other source remote from the controller 230. The data set may be in the form of machine instructions executable by the controller 230, or as input data for an assembly program residing in the memory or otherwise executable by the controller 230. Although the method 700 is described as being performed utilizing the assembly tool 500, IC packages 210 may be assembled using the method 700 using other assembly tools.

At operation 704, the controller 230, in response to the data set, instructs the die handler 108 to retrieve dies 110 from the die pool in accordance with the assembly rule. The dies 110 are mounted on a substrate 206 utilizing solder paste 212 to form the.

At operation 706, the IC package 210 is move to the reflow station 220. In the reflow station 220, the entire IC package 210 is heated to a temperature that melts the solder comprising the solder paste 212, and then cools and solidifies the melted solder into a solder connection, such as a micro-bump, that permanently connects the circuitry of the substrate 206 and dies 110 forming the IC package 210. The IC package 210 may be heated by passing the IC package 210 through a reflow oven, under an infrared lamp or by soldering individual joints with a hot air pencil. After processing in the reflow station 220, the IC package 210 may have one or more finishing operations performed, such as disposing underfill material between the dies 110 and substrate 206, securing stiffeners to the substrate 206, disposing a lid over the dies 110, adding heat sinks, and the like. Advantageously, by utilizing the data set provided by method 600 during the assembly method 700, production yields are substantially higher, thus contributing to lower manufacturing and product costs.

Thus, an integrated circuit (IC) package apparatus and techniques for assembling IC chip packages have been described above that advantageously reduce fabrication costs by increasing yield as compared to conventional fabrication techniques. Significantly, die utilization can be increase at least as much as 10 percent over convention techniques. The increased yield advantageously reduces fabrication costs, which ultimately reduces the cost of each IC package.

While the foregoing is directed to embodiments of the present invention, other and further embodiments of the invention may be devised without departing from the basic scope thereof, and the scope thereof is determined by the claims that follow.

What is claimed is:

1. A method for fabricating an integrated circuit (IC) package, the method comprising:
   determining a first package assembly yield using a first assembly rule, for a predefined type of IC package having at least two or more dies, based on a predefined package performance criteria across a first die pool comprising a first plurality of dies, each of the first plurality of dies comprising the first die pool having a performance criteria within a first predefined range;
   determining a second package assembly yield using a second assembly rule, for the predefined type of IC package, based on the predefined package performance criteria across a second die pool comprising a second plurality of dies, the second plurality of dies comprising a portion of the first plurality of dies, the second plurality of dies having a performance criteria within a second predefined range of performance criteria that is different than the first predefined range of performance criteria, wherein the first die pool has at least one die having a higher power consumption than a highest power consuming die of the second die pool; and
   generating a final assembly sequence, for the predefined type of IC package, in response to analyzing the second package assembly yield and the first package assembly yield, the final assembly sequence comprising rules for combining dies in accordance with obtaining a higher of the first package assembly yield and the second package assembly yield.

2. The method of claim 1, wherein generating the final assembly sequence further comprises:
   selecting a final assembly rule utilized to obtain the first package assembly yield as the final assembly sequence in response to the second package assembly yield being less than the first package assembly yield.

3. The method of claim 1, wherein at least one die in the first die pool has a power higher than a highest powered die in the second die pool.

4. The method of claim 1 further comprising:
   iteratively determining package assembly yields that are more than the second package assembly yield prior to determining the final assembly rule.

5. The method of claim 1, wherein the performance criteria is power consumption.

6. The method of claim 5 further comprising:
   iteratively determining package assembly yields that are more than the second package assembly yield prior to determining the final assembly rule, wherein each iteratively determined package assembly yield is based on a die pool having a different highest power consuming die.

7. The method of claim 1, wherein a number of dies in each of the first and second die pools is different.

8. The method of claim 1 further comprising:
   testing dies and separating the tested dies into bins in accordance with a performance criteria determined while testing, the tested dies comprising the first die pool.

9. The method of claim 1 further comprising:
   assembling the package in accordance with the final assembly sequence in a robotic assembly tool.

10. A method for fabricating an integrated circuit (IC) package, the method comprising:
   (A) from a die pool comprising a plurality of die, selecting a first predetermined number of dies for assembly into IC packages each having at least two or more dies, the first predetermined number of dies having an actual performance criteria closest to a first end of a range of performance criteria for the dies across the die pool, wherein the performance criteria is power consumption;
   (B) determining that the first predetermined number of dies are acceptable for assembly into the IC packages in response to the actual performance criteria for the first predetermined number of dies satisfying a target performance criteria for the IC packages;
   (C) selecting from the die pool, a replacement die to replace a selected die of the first predetermined number of dies for forming the IC packages in response to the actual performance criteria for the first predetermined number of dies not satisfying the target performance criteria for the IC packages, the replacement die and dies remaining from the first predetermined number of dies satisfying the target performance criteria for the IC packages, the replacement die having a power consumption greater than a power consumption of each of the dies remaining from the first predetermined number of dies satisfying the target performance criteria for the IC packages;

(D) removing dies combinable to form the IC packages at (A), (B) and (C) from the die pool; and (E) iteratively performing (A), (B), (C) and (D) until no more IC packages satisfying the target performance criteria can be formed from the die pool.

11. The method of claim 10, wherein selecting the replacement die further comprises:
selecting the replacement die based on an actual performance criteria for the replacement die being closest to the actual performance criteria of the first predetermined number of dies from dies remaining in the die pool.

12. The method of claim 11, wherein selecting the replacement die further comprises:
selecting the replacement die based on the actual performance criteria of the replacement die being in a same order as the remaining dies by actual performance criteria as compared to the first predefined number of dies when ordered by actual performance criteria.

13. The method of claim 10 further comprising:
removing the selected die from the die pool.

14. The method of claim 13 further comprising:
after performing (E), adding dies selected when performing (C) to a new die pool; and
iteratively performing (A), (B), (C) and (D) until no more IC packages can be formed from the new die pool.

15. The method of claim 10 further comprising:
identifying a specific die from the die pool in an input station by reading a tag disposed on the specific die or on a carrier containing the specific die.

16. The method of claim 10, wherein when iteratively performing (A), (B), (C) and (D), (A) further comprises:
selecting dies remaining in the die pool having an actual performance criteria closest to the first end of the range of performance criteria for the dies across the die pool.

17. The method of claim 10 further comprising:
testing the dies and identify the tested dies in accordance with a performance criteria determined while testing utilizing one or more tags applied to the tested dies or a carrier containing the tested dies.

18. The method of claim 10 further comprising:
assembling the IC packages in accordance with (A), (B), (C), and (E) in a robotic assembly tool.

* * * * *